United States Patent
Miller et al.

(10) Patent No.: US 6,535,783 B1
(45) Date of Patent: Mar. 18, 2003

(54) METHOD AND APPARATUS FOR THE INTEGRATION OF SENSOR DATA FROM A PROCESS TOOL IN AN ADVANCED PROCESS CONTROL (APC) FRAMEWORK

(75) Inventors: Michael Lee Miller, Cedar Park, TX (US); Scott G. Bushman, Richardson, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 64 days.

(21) Appl. No.: 09/799,408

(22) Filed: Mar. 5, 2001

(51) Int. Cl.$^7$ ................................................ G06F 11/00
(52) U.S. Cl. .................. 700/121; 700/95; 700/108; 700/109; 714/47; 714/48; 438/5
(58) Field of Search .................. 700/121, 95, 108–109; 714/47–48; 438/5

(56) References Cited

U.S. PATENT DOCUMENTS

| | | | | |
|---|---|---|---|---|
| 5,787,190 A | * | 7/1998 | Peng et al. .................. 382/145 |
| 5,859,964 A | * | 1/1999 | Wang et al. .................. 714/48 |
| 5,864,773 A | * | 1/1999 | Barna et al. ................. 702/182 |
| 5,896,294 A | * | 4/1999 | Chow et al. ................. 700/109 |
| 5,939,886 A | * | 8/1999 | Turner et al. ............ 315/111.21 |
| 5,963,884 A | * | 10/1999 | Billington et al. ............. 702/56 |
| 6,065,128 A | * | 5/2000 | Harvey ........................ 700/121 |
| 6,070,196 A | * | 5/2000 | Mullen, Jr. .................. 370/463 |
| 6,097,887 A | * | 8/2000 | Hardikar et al. ............. 717/105 |
| 6,130,414 A | * | 10/2000 | Toprac ........................ 219/497 |

* cited by examiner

Primary Examiner—Leo Picard
Assistant Examiner—Michael D. Masinick
(74) Attorney, Agent, or Firm—Williams, Morgan & Amerson

(57) ABSTRACT

A method and apparatus for integrating tool sensor data in an Advanced Process Control (APC) application. A sensor receives operational state data of a processing tool related to the manufacture of a processing piece. The state data is sent from the sensor to a data server and accumulated therein. The data server processes the state data and forwards the data to an APC framework. The APC framework then forwards the state data to a fault detection unit. The fault detection unit determines if a fault condition exists with the processing tool based upon the state data. A predetermined action is performed on the processing tool in response to the presence of a fault condition. In accordance with one embodiment, the predetermined action is to shutdown the processing tool so as to prevent further production of faulty wafers.

22 Claims, 5 Drawing Sheets

METHOD AND APPARATUS FOR THE INTEGRATION OF SENSOR DATA FROM A PROCESS TOOL IN AN ADVANCED PROCESS CONTROL (APC) FRAMEWORK

BACKGROUND OF THE INVENTION

1. Field of the Invention

This invention relates generally to semiconductor fabrication technology, and, more particularly, to a method and apparatus for integrating sensor data in an Advanced Process Control (APC) framework.

2. Description of the Related Art

There is a constant drive in the semiconductor industry to increase the quality, reliability, and throughput of integrated circuit devices such as microprocessors, memory devices and the like. This drive is fueled by consumer demands for higher quality computers and electronic devices that operate more reliably.

These demands by the consumer have resulted in some improvements in the manufacture of semiconductor devices as well as in the manufacture of integrated circuit devices incorporating such semiconductor devices. Reducing defects in the manufacture of these devices lowers the cost of the devices themselves. Accordingly, the cost of the final product incorporating these devices is also reduced, thus providing inherent monetary benefits to both the consumer and manufacturer.

Although there has been an improvement in detecting faults associated with semiconductor manufacturing processes, one problem currently encountered by the semiconductor manufacturing industry is the delay in reporting these faults such that corrective measures can be implemented in a more expedient manner. As a result of this delay, several faulty devices are produced, which undesirably increases costs for the manufacturer and consumer.

The present invention is directed to overcoming, or at least reducing the effects of, one or more of the problems set forth above.

SUMMARY OF THE INVENTION

In one aspect of the present invention, a method is provided for fault detection in a manufacturing process. The method includes obtaining operational state data of a processing tool related to the manufacture of a processing piece. The state is collected and processed at a data server. The processed state data is sent from the data server to a first interface.

In another aspect of the present invention, a system is provided for fault detection in a manufacturing process. The system includes a processing tool adapted to manufacture a processing piece, and a sensor adapted to obtain operational state data of the processing tool related to the manufacture of the processing piece. The system further includes a data server adapted to collect the state data from the sensor and process the state data, and a first interface, coupled to the data server, and adapted to receive the processed state data from the data server.

BRIEF DESCRIPTION OF THE DRAWINGS

The invention may be understood by reference to the following description taken in conjunction with the accompanying drawings, in which like reference numerals identify like elements, and in which.

Figure 1:
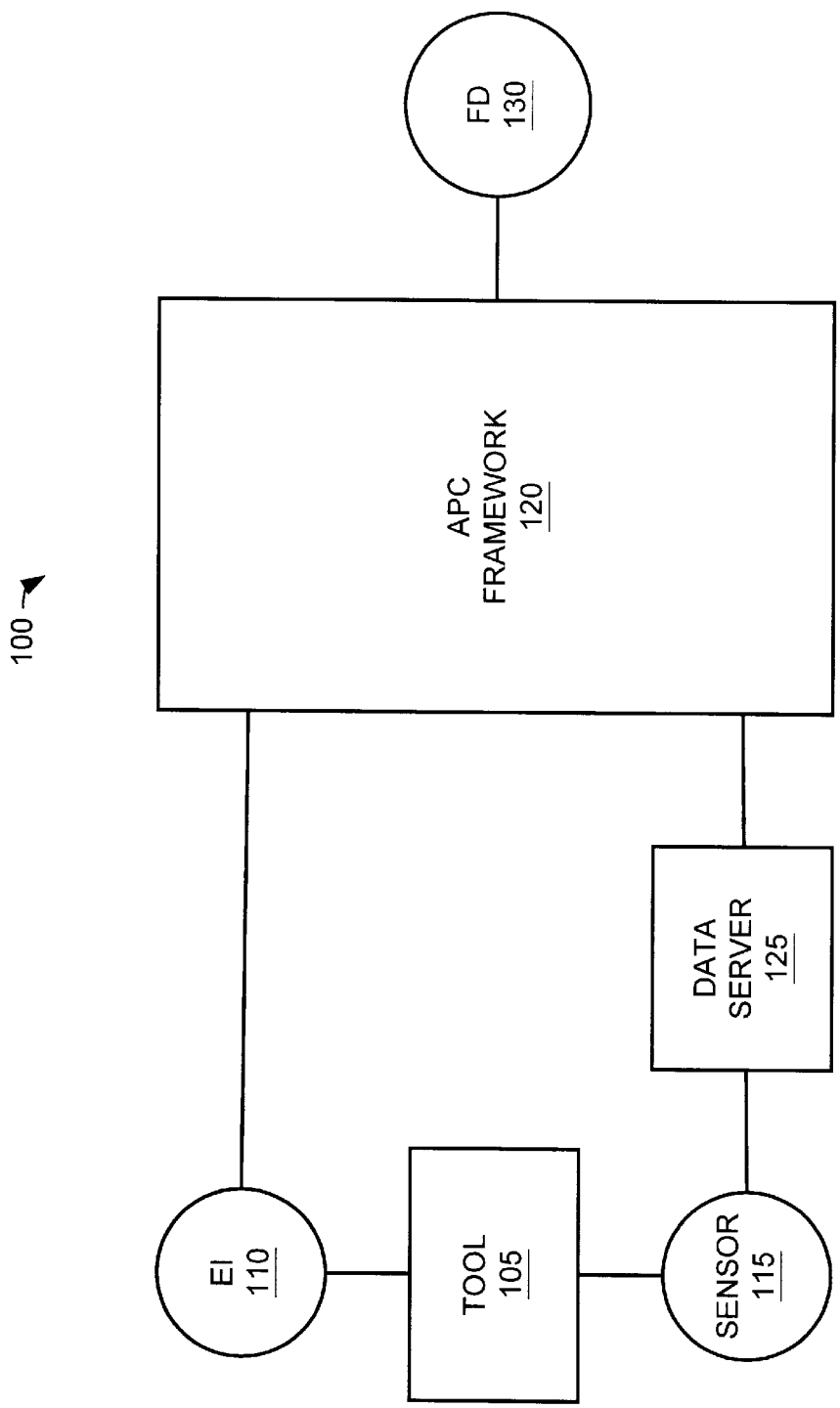
FIG. 1 illustrates a manufacturing system, including an APC framework, for providing fault detection of a processing tool in accordance with one embodiment.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and specifically referring to FIG. 1, a system 100 for integrating sensor data related to the operational state of semiconductor fabrication equipment within an advanced process control (APC) application is provided. The system 100 includes a processing tool 105, which in the illustrated embodiment, is in the form of semiconductor fabrication equipment used to produce a processing piece, such as a silicon wafer. The processing tool 105, in accordance with one embodiment, may be an exposure tool, commonly known as a "stepper." It will be appreciated, however, that the processing tool 105 need not necessarily be limited to a stepper, or even to a tool for producing silicon wafers, but may include other types of manufacturing equipment for producing a variety of different types of commercial products without departing from the spirit and scope of the present invention.

The processing tool 105 is coupled to an equipment interface (EI) 110, which sends various control signals to the tool 105. These control signals are received from an Advanced Process Control (APC) framework 120, and are used to control the operation of the processing tool 105, such as starting and stopping the operation of the tool 105, for example. A sensor 115 is also coupled to the processing tool 105 to measure tool operational state data from the tool 105. The tool state data may include, but is not necessarily limited to, temperature, pressure, and gas flow measurements from the processing tool 105. For example, the sensor 115 may be used to determine whether the silicon wafer was produced by the tool 105 within acceptable operational limits, such as within a certain temperature range. It will be appreciated, however, that the sensor 115 may be used to record various other operational state parameters, and, thus, need not be limited to the aforementioned example. It will further be appreciated that a plurality of sensors 115 may be used to monitor various other operational states of the tool 105; however, for the sake of simplicity and clarity, only one sensor 115 is shown in FIG. 1.

The sensor 115 may be embodied as a simple data acquisition program, such as a C++ standalone program acquiring data from a thermocouple wire, for example. Alternatively, the sensor 115 may be embodied as a full-fledged LABVIEW® application, acquiring data through multiple transducers (not shown). The tool operational state data is collected from the tool 105 through the sensor 115. The sensor 115, upon receiving the tool state data, forwards the tool data to a data server 125. In accordance with the illustrated embodiment, the data server 125 is a software-controlled, centralized database that collects tool state data from the sensor 115 and puts the data into text files, for example.

According to one embodiment, the data server 125 may be implemented as a large capacity hard drive (not shown) with a processor (also not shown) for controlling the operation of storing and processing the tool state data received from the sensor 115. In the illustrated embodiment, the data server 125 is located remote from the APC framework 120. It will be appreciated, however, that the data server 125 may alternatively be an integral component of the APC framework 120 without departing from the spirit and scope of the present invention. It will further be appreciated that the data server 125 may be configured to receive tool state data from a plurality of sensors 115 that may be directly coupled to the tool 105. Additionally, the data server 125 may be configured to handle tool state data from other tools (not shown) via their associated sensors (also not shown). However, for the sake of simplicity and clarity, only one tool 105 and sensor 115 is shown.

According to one embodiment, the data server 125 has a software-control program running on the processor, and detects the arrival of the tool operational state data from the tool 105 that was forwarded by the sensor 115. As mentioned, the tool state data for the tool 105, according to one embodiment, is stored in the form of text files within the data server 125. The data server 125 organizes the text files, and runs the tool state data within these files through various data processing steps prior to sending the tool data to the APC framework 120 for analysis by the fault detection unit 130. The data processing performed on the tool state data may include, but is not necessarily limited to, data compression of the tool state data, outliner elimination, etc. The data server 125, after formatting the tool state data for suitable use by the APC framework 120, forwards the formatted data to the APC framework 120 for analysis.

A fault detection (FD) unit 130, which couples to the APC framework 120, receives the state data of the tool 105 as collected by the data server 125 via the APC framework 120. Prior to sending the data to the fault detection unit 130, the APC framework 120 translates the tool state data from the data server 125 to a format that is recognizable to the fault detection unit 130 in a manner that is well known to those of ordinary skill in the art. In accordance with one embodiment, the fault detection unit 130 includes a commercially available software package, such as ModelWare®, for example, that provides fault detection analysis of the processing tool 105 based upon the tool state data forwarded by the data server 125. It will be appreciated, however, that other types of fault detection software could also be used in lieu thereof without departing from the spirit and scope of the present invention.

In accordance with one embodiment, the fault detection unit 130 compares the received tool state data forwarded from the data server 125 to fault model data. The fault model data includes tool state data of other similar-type tools, where it was previously known that such tools have operated within acceptable operational limits. The types of faults that could be detected by the fault detection unit 130 include processing and/or operational faults in silicon wafer fabrication. Examples of processing faults may include, but are not necessarily limited to, non-optimal preheating of the chamber, catastrophic failure where a broken wafer is detected, abnormal N2 flow rate, temperature overshoots at the top of a ramp, tube temperature measurement drifts, etc. Some examples of operational faults detected by the fault detection unit 130 may include interrupted/resumed processing, no wafer sleuth or improper wafer sleuth prior to Rapid Thermal Anneal (RTA), etc.

The fault detection unit 130, upon evaluating the tool state data sent from the data server 125, sends the results of potential faults and/or proper operation of the tool 105 to the APC framework 120. The APC framework 120, in turn, may send control signals to the equipment interface 110 to control the processing tool 105 based upon the results forwarded from the fault detection unit 130. For example, the control signal sent from the APC framework 120 may be to shut down the tool 105 to prevent any additional faulty production of wafers (providing this was determined by the fault detection unit 130). Data could also be sent from the APC framework 120 to inform a technician on how to rectify a faulty condition of the tool 105, if so desired. The technician may be informed of such a fault and possible solutions to clear the fault through a graphical user interface (GUI) (not shown), for example.

Figure 2:
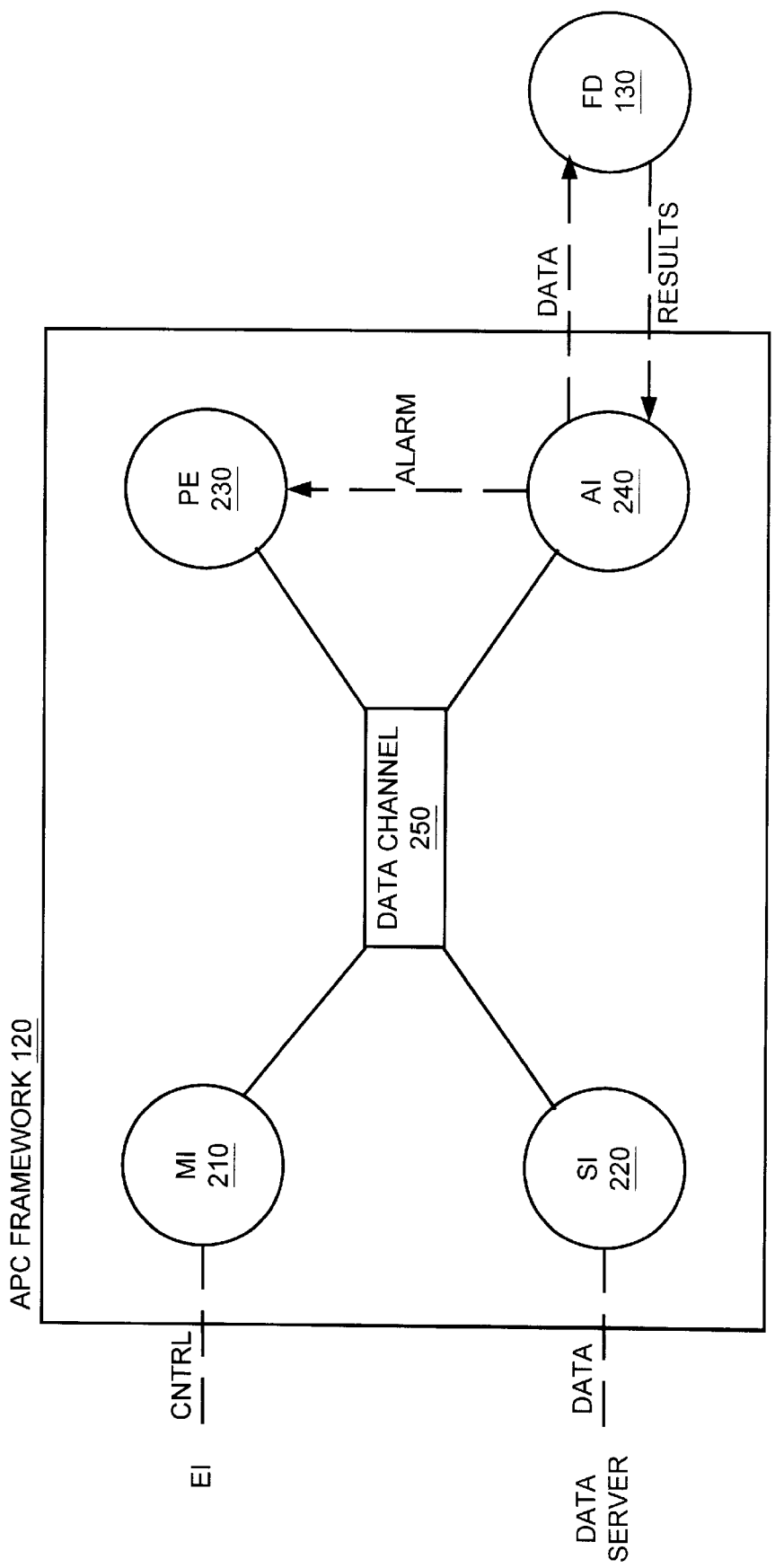
FIG. 2 depicts the detail of the APC framework of FIG. 1.

Turning now to FIG. 2, a more detailed representation of the APC framework 120 is provided. The APC framework 120 is a component-based architecture comprised of interchangeable, standardized software components enabling run-to-run control and fault detection of the processing tool 105. The APC framework 120 includes a machine interface (MI) 210 for interfacing the tool 105 to the framework 120 to send control signals to the tool 105. The APC framework 120 further includes a sensor interface (SI) 220 for interfacing the data server 125 with the framework 120. The sensor interface 220 collects the tool state data of the processing tool 105 that was forwarded by the sensor 115 through the data server 125. Although only one sensor interface 220 is provided, it will be appreciated that several sensor interfaces may be included without departing from the spirit and scope of the present invention. A plan executor (PE) 230 (i.e., a process controller) manages the APC framework 120 and provides possible solutions to problems found with the tool state data that was determined by the fault detection unit 130. The framework 120 further includes an applications interface (AI) 240 for interfacing with third-party applications that run on the fault detection unit 130 to analyze the tool state data received via the data server 125. In the illustrated embodiment, the third-party application is the fault detection unit 130. A data channel 250 is further provided to allow for communication between the machine and sensor interfaces 210, 220, the plan executor 230, and the applications interface 240 of the APC framework 120.

The machine interface 210 couples to the equipment interface 110 to serve as an interface between the processing tool 105 and the APC framework 120. The machine interface 210 supports the setup, activation, monitoring, and data collection of the tool 105. It receives commands, status events, and collected data from the equipment interface 110 and forwards this information to other components of the APC framework 120, namely the plan executor 230 and applications interface 240. Any responses that are received by the machine interface 210 from the other components of the APC framework 120 are routed to the equipment interface 110 for delivery to the processing tool 105. As previously discussed, this may include a signal from the plan executor 230 to manipulate the tool 105 if a faulty condition is detected.

The machine interface 210 also reformats and restructures the messages between the specific communications protocol utilized by the equipment interface 110 and the Common Object Request Broker Architecture Interface Definition Language (CORBA IDL) communications protocol used by the components of the APC framework 120. The manner in which the machine interface 210 performs such translation between the equipment interface-specific communications protocol and the CORBA IDL protocol of the APC framework 120 is well known to those of ordinary skill in the art. Accordingly, the specific translation process between these two formats will not be discussed herein to avoid unnecessarily obscuring the present invention.

The sensor interface 220 serves as an interface between the data server 125 and the APC framework 120. The sensor interface 220 provides setup, activation, monitoring, and data collection from the data server 125, which includes the tool state data forwarded from the sensor 115. Similar to the machine interface 210, the sensor interface 220 also reformats and restructures the messages between the specific communications protocol utilized by the data server 125 and the CORBA IDL protocol used by the components of the APC framework 120.

The applications interface 240 supports the integration of third-party tools (e.g., commercial software packages, such as ModelWare, MatLab, and Mathematica, for example) to the APC framework 120. Typically, these third-party tools do not provide the standard CORBA IDL protocol known to the APC framework 120. Accordingly, the applications interface 240 provides the necessary translation between the communications protocol utilized by the third-party tool and the CORBA protocol used by the APC framework 120.

In the illustrated embodiment, the third-party tool is the fault detection unit 130 for analyzing the tool state data of the processing tool 105 that is supplied via the sensor interface 220. In one embodiment, the fault detection unit 130 includes ModelWare® software for providing fault detection; however, it will be appreciated that other commercially available fault detection software could also be used without departing from the spirit and scope of the present invention.

The plan executor 230 performs control functions based upon the results determined by the fault detection unit 130. When the applications interface 240 receives the results from the fault detection unit 130, it forwards a copy of the results (usually in the form of an alarm signal) to the plan executor 230. Upon inspection of the results, the plan executor 230 attempts to rectify any fault conditions found with the tool 105. In accordance with one embodiment of the present invention, the response to a fault condition may be for the plan executor 230 to send a control signal to the machine interface 210 to shut down the tool 105 so as to prevent further manufacturing of faulty silicon wafers. The plan executor 230, in addition to shutting down the tool 105, may also apprise a technician of any potential solutions to rectify the fault condition through a graphical user interface (GUI) (not shown), for example, before the tool 105 may commence operation once again.

In accordance with the present invention, the sensor 115 obtains the tool state data from the tool 105 and forwards the data to the data server 125. The data server 125 stores the tool data obtained from the sensor 115 in text files that are associated with a particular tool's operational performance. In accordance with one embodiment of the present invention, the data server 125 may perform various data processing steps on the tool data files, such as data compression, for example. The data server 125, upon completing these processing steps, forwards the processed tool data to the sensor interface 220 of the APC framework 120.

The sensor interface 220, upon receiving the tool state data from the data server 125, sends the tool state data it receives to the plan executor 230. The plan executor 230 then buffers the received tool state data until the occurrence of a predetermined event. The predetermined event, in accordance with one embodiment, may include the completion of processing of a lot (or batch) of wafers by the tool 105, for example. It will be appreciated, however, that the predetermined event need not be limited to this particular example, but could include the occurrence of other events as well. When the batch is complete, the plan executor 230 sends the accumulated tool state data of the processing tool 105 to the applications interface 240, which then sends the data to the fault detection unit 130.

The fault detection unit 130 subsequently analyzes the received data by comparing the tool state data of the processing tool 105 to a fault model, which contains tool state data from tools that have operated within acceptable limits. Subsequent to comparing the data and detecting any fault conditions that may exist in the manufacturing process, the fault detection unit 130 sends the results back to the applications interface 240, which then forwards the results to the plan executor 230 for appropriate action. In accordance with one embodiment, the tool 105 may be shut down if the tool state data was deemed unacceptable by the fault detection unit 130.

Figure 3A:
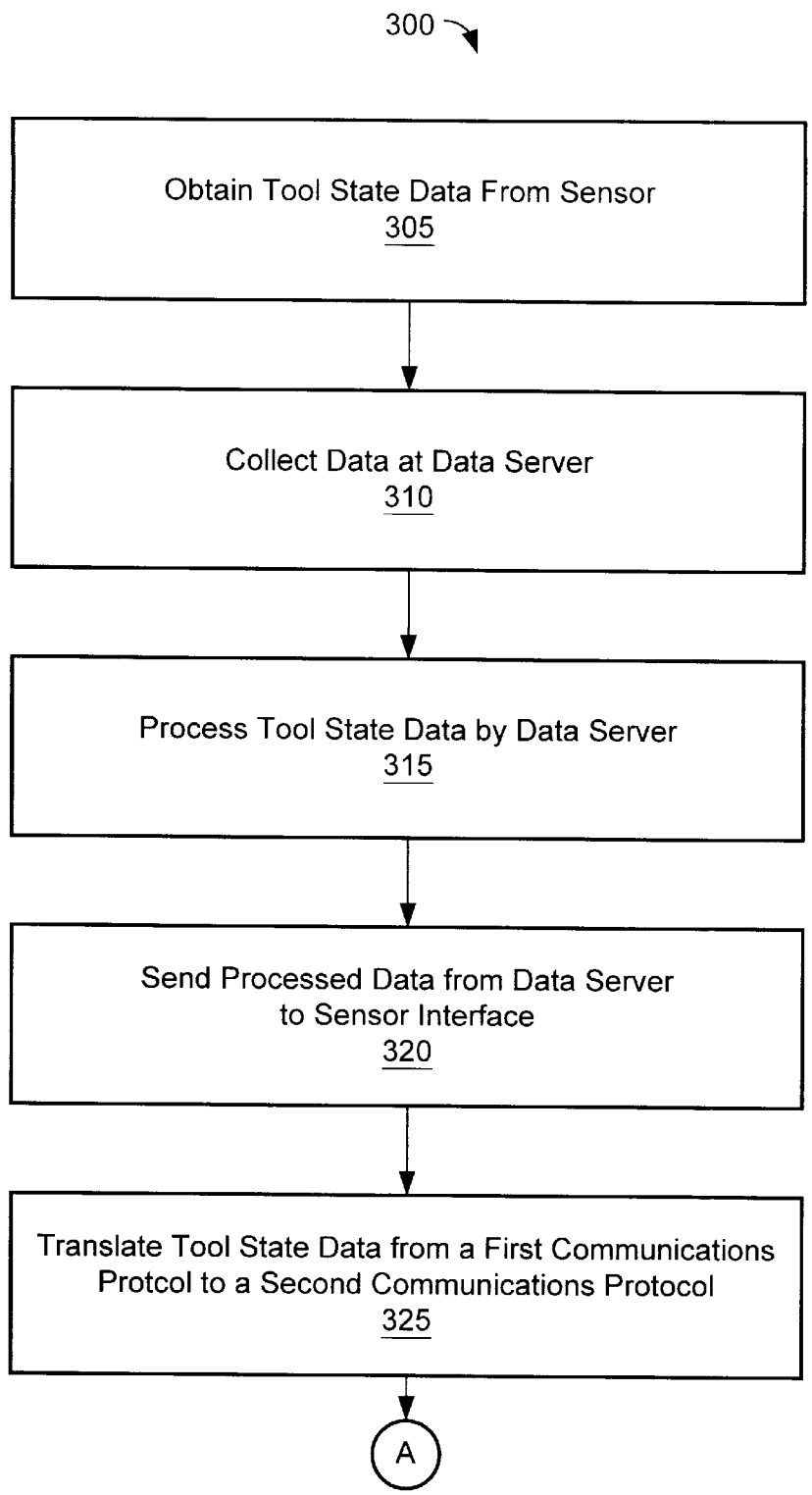
FIGS. 3A–C show a process for providing fault detection capability for the manufacturing system of FIG. 1.
Figure 3B:
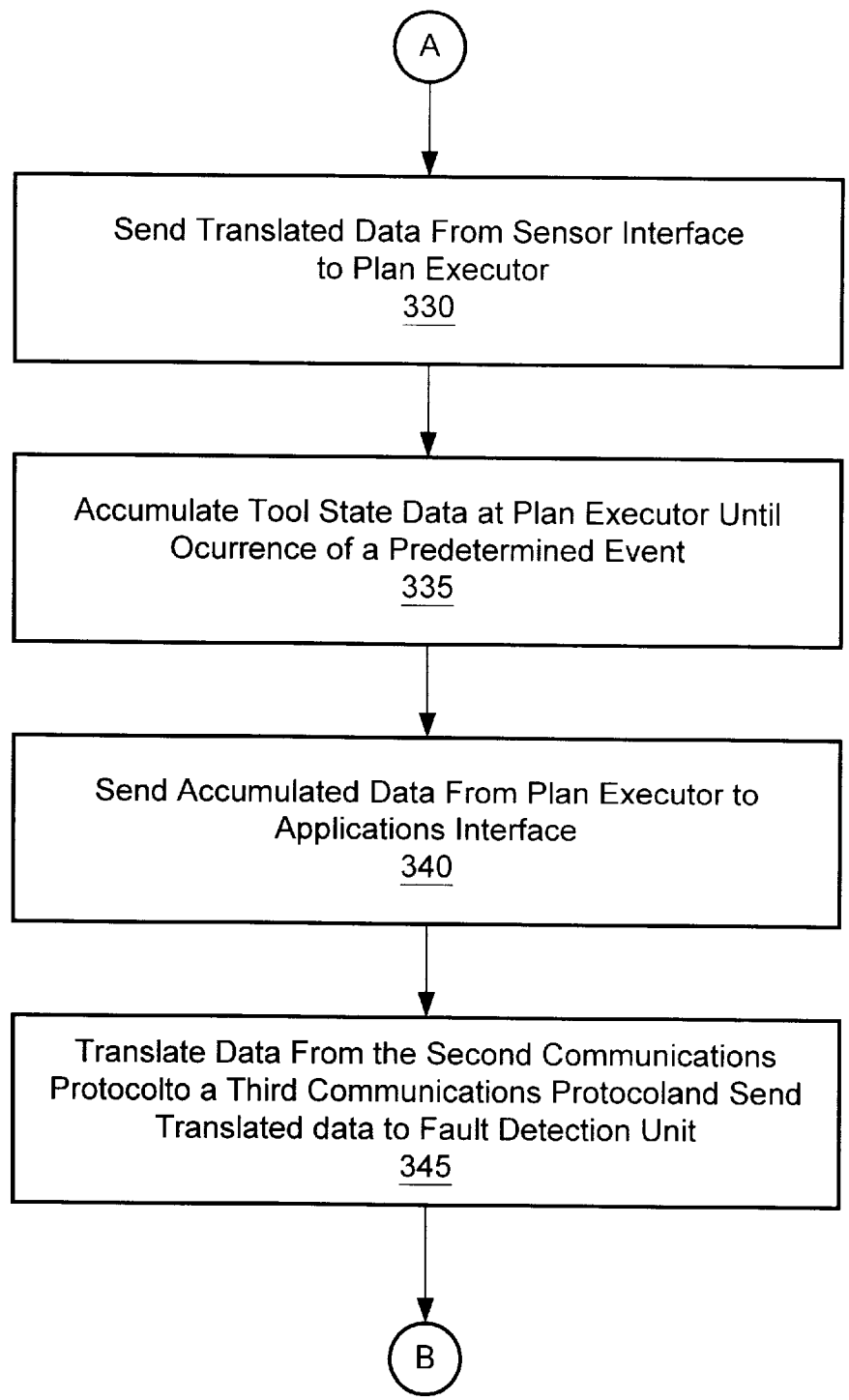
Figure 3C:
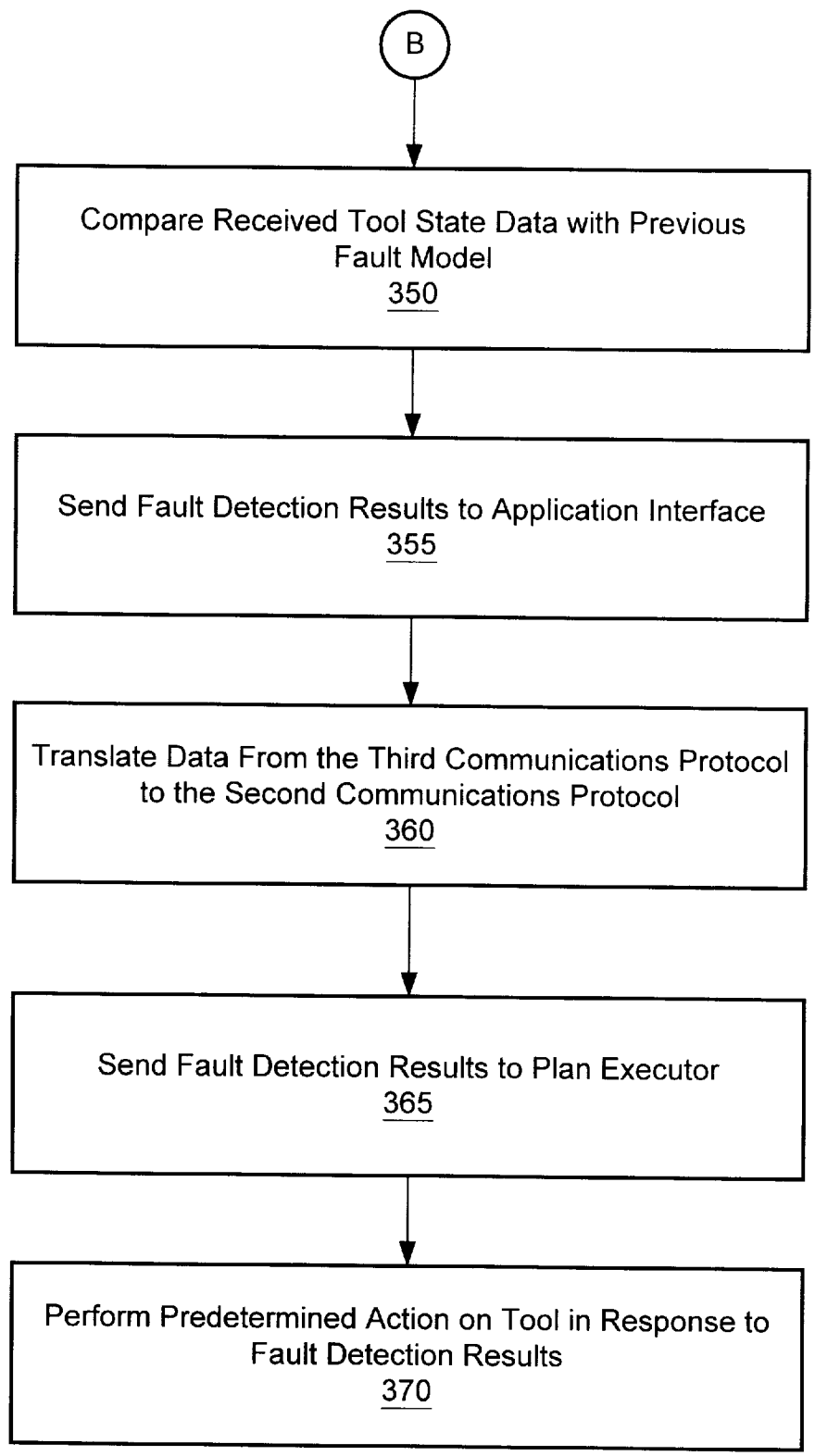

Turning now to FIGS. 3A–C, a process 300 for integrating sensor data related to the operational state of the processing tool 105 with an APC application is provided. The process commences at block 305, where the tool state data of the processing tool 105 is obtained by the sensor 115. The tool state data may include temperature, pressure, and gas flow measurements from the processing tool 105. Of course, the tool state data may include various other parameters, and, thus, need not necessarily be limited to the aforementioned examples.

Once the tool state data is obtained by the sensor 115, the data is collected at the data server 125 at block 310. Software running on the data server 125 detects the arrival of the tool state data and performs data processing on the data at block 315. The tool state data for the tool 105 according to one embodiment is stored in the form of text files within the data server 125. The data server 125 organizes the text files, and runs the tool state data within these files through various data processing steps prior to sending the tool data to the APC framework 120 for analysis by the fault detection unit 130. The data processing performed on the tool state data may include, but is not necessarily limited to, data compression of the tool state data, outliner elimination, etc.

The data server 125, after formatting the tool state data for suitable use by the APC framework 120, forwards the formatted data to the sensor interface 220 at block 320. The sensor interface 220 translates the tool state data into a format that is recognizable to the plan executor 230 and the applications interface 240 of the APC framework 120 in a manner well known to those skilled in the art at block 325. In accordance with one embodiment, the translation involves the reformatting and restructuring of the messages between the specific communications protocol used by the data server 125 and the CORBA IDL protocol used by the APC framework 120. The sensor interface 220, upon translating the tool state data to the CORBA IDL standard, sends the data to the plan executor 230 at block 330.

The plan executor 230 accumulates the tool state data from the sensor interface 220 until the occurrence of a predetermined event at block 335. The predetermined event, in accordance with one embodiment, may be the completion of a particular lot of wafers by the processing tool 105. It will be appreciated, however, that the predetermined event need not necessarily be defined by the completion of a lot of wafers, but could include other events as well.

The tool state data that is accumulated at the plan executor 230 is sent to the applications interface 240 upon occurrence of the predetermined event at block 340, which in the illustrated embodiment, is the completion of a lot of wafers by the processing tool 105. The applications interface 240 translates the tool state data from the CORBA IDL communications protocol utilized by the APC framework 120 to a protocol used by the fault detection unit 130, and subsequently sends the data to the fault detection unit 130 at block 345. As previously discussed, the manner in which the applications interface 240 translates the data into the proper communications protocol is well known to those of ordinary skill in the art, and will differ depending on the particular type of fault detection software used.

The fault detection unit 130, after receiving the tool state data from the applications interface 240, compares the data to a fault model at block 350. As mentioned, the fault model includes tool state data from other similar-type tools in which it was previously known that such tools manufactured silicon wafers within acceptable operational limits.

Subsequent to comparing the tool state data of the tool 105 to the fault model, the fault detection unit 130 sends the results of the comparison to the applications interface 240 at block 355. The applications interface 240 then subsequently translates the received results from the fault detection unit 130 into the CORBA IDL protocol used by the APC framework 120 at block 360. The applications interface 240 then forwards the results to the plan executor 230 at block 365, which is typically done in the form of an alarm signal. That is, an alarm signal is generated if a fault in the manufacturing process was determined from the tool state data. The plan executor 230, after receiving the alarm signal from the application interface 240, determines whether to perform a predetermined action on the processing tool 105 based upon the results from the fault detection unit 130 at block 370. In accordance with one embodiment, the plan executor 230 may send a control signal to the equipment interface 110 to shut down the tool 105 so as to prevent the further production of faulty wafers by the tool 105.

In addition to the tool state data being obtained via the sensor 115, as described in process 300 above, the tool state data may also be derived from the tool 105 itself. In this embodiment, the tool state data from the tool 105 is collected at the equipment interface 110 and then forwarded to the machine interface 210. The tool state data collected by the machine interface 210 is then forwarded to the plan executor 230. In this particular embodiment, the tool state data accumulated at the plan executor 230 from the machine interface 210 may be added or merged with the tool state data sent from the sensor 115. The merged tool state data from the tool 105 and the sensor 115 at the plan executor 230 may then be processed as described in blocks 335–370 as shown in FIG. 3.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    obtaining operational state data of a processing tool related to the manufacture of a processing piece;
    collecting the state data at a data server;
    processing the state data at the data server by a processor within the data server;
    sending the processed state data from the data server to a first interface;
    sending the processed state data from the first interface to a fault detection unit;
    determining if a fault condition exists with the processing tool based upon the state data; and
    performing a predetermined action on the processing tool in response to the presence of a fault condition.

2. The method of claim 1, wherein sending the processed state data from the first interface to a fault detection unit further comprises:
    sending the state data from the first interface to a controller;
    accumulating the state data at the controller; and
    sending the accumulated state data from the controller to the fault detection unit upon occurrence of a predetermined event.

3. The method of claim 1, further comprising:
    sending an alarm signal indicative of the fault condition to the controller from the fault detection unit providing that a fault condition of the processing tool was determined by the fault detection unit.

4. The method of claim 1, wherein performing a predetermined action further comprises:
    sending a signal by the process controller to a second interface reflective of the predetermined action.

5. The method of claim 4, wherein performing sending a signal by the process controller to a second interface further comprises:
    sending a signal by the process controller to a second interface to shut down the processing tool providing that a faulty condition exists.

6. The method of claim 2, further comprising:
    translating the state data at the first interface from a first communications protocol used by the data server to a second communications protocol used by the controller.

7. The method of claim 2, further comprising:
    receiving the state data at a third interface from the controller prior to sending the state data to the fault detection unit.

8. The method of claim 7, further comprising:
    translating the state data at the third interface from the second communications protocol used by the controller to a third communications protocol used by the fault detection unit.

9. The method of claim 2, wherein determining if a fault condition exists, further comprises:

comparing the state data received at the controller to predetermined state data at the fault detection unit.

10. The method of claim 2, wherein sending the accumulated state data from the controller to the fault detection unit upon occurrence of a predetermined event, further comprises:

sending the accumulated state data from the controller to the fault detection unit upon completion of a lot of processing pieces processed by the tool.

11. A system, comprising:

a processing tool adapted to manufacture a processing piece;

a sensor adapted to obtain operational state data of the processing tool related to the manufacture of the processing piece;

a data server adapted to collect the state data from the sensor and process the state data, the data server including a processor for processing the state data;

a first interface, coupled to the data server, and adapted to receive the processed state data from the data server;

a fault detection unit adapted to determine if a fault condition exists with the processing tool based on the operational state data; and a framework, including the first interface, adapted to receive the state data from the data server, to send the data to the fault detection unit, and to perform a predetermined action on the processing tool in response to the presence of a fault condition.

12. The system of claim 11, wherein the framework includes:

a controller adapted to receive and accumulate the state data as the data is received by the first interface, and to send the state data to the fault detection unit upon occurrence of a predetermined event.

13. The system of claim 11, wherein the first interface is further adapted to translate the state data between a first communications protocol used by the data server and a second communications protocol used by the framework.

14. The system of claim 12, wherein the framework further includes:

a second interface, coupled between the controller and the fault detection unit, and adapted to receive the state data from the controller prior to sending the data to the fault detection unit.

15. The system of claim 14, wherein the second interface is further adapted to translate the state data from the second communications protocol used by the framework to a third communications protocol used by the fault detection unit.

16. The system of claim 11, wherein the fault detection unit is further adapted to compare the state data of the processing tool to predetermined state data to determine the presence of the fault condition.

17. The system of claim 11, wherein the processing tool is a semiconductor fabrication tool, and the processing piece is a silicon wafer.

18. The system of claim 11, wherein the framework is an Advanced Process Control (APC) framework.

19. The system of claim 13, wherein the framework is an Advanced Process Control (APC) framework, and the second communications protocol used by the framework is a Common Object Request Broker Architecture Interface Definition Language (CORBA IDL).

20. The system of claim 14, wherein the second interface is further adapted to send an alarm signal to the controller providing that a fault condition was determined by the fault detection unit.

21. The system of claim 12, wherein the controller is further adapted to send a control signal to a third interface reflective of the predetermined action providing that a fault condition exists.

22. The system of claim 21, wherein the predetermined action is to shut down the processing tool.

* * * * *